United States Patent [19]

Komatsu et al.

[11] Patent Number: 4,992,725
[45] Date of Patent: Feb. 12, 1991

[54] METER FOR ACCURATELY MEASURING INTEGRATED ELECTRIC POWER

[75] Inventors: Masatoshi Komatsu; Shigeo Fushimi; Shigenori Wada; Hidetake Nakamura; Tadashi Kobayashi; Toshio Takagi, all of Tokyo, Japan

[73] Assignee: NEC Corporation and the Tokyo Electric Power Company, Incorporated, Japan

[21] Appl. No.: 454,510

[22] Filed: Dec. 21, 1989

[51] Int. Cl.$^5$ .................................... G01R 21/06
[52] U.S. Cl. ............................ 324/142; 324/111
[58] Field of Search .......... 324/142, 107, 111, 103 R; 328/160; 364/483

[56] References Cited

U.S. PATENT DOCUMENTS

| | | | |
|---|---|---|---|
| 4,451,784 | 5/1984 | Milkovic | 324/111 |
| 4,456,878 | 6/1984 | Gamoh | 324/142 |
| 4,514,686 | 4/1985 | Mayfield | 324/142 |

*Primary Examiner*—Ernest F. Karlsen
*Attorney, Agent, or Firm*—Laff, Whitesel, Conte & Saret

[57] ABSTRACT

In a watt-hour meter in which first and second input signals representing an analog electric current and an analog voltage of an alternating current are converted into first and second digital signals, a first adder produces a sum signal which represents a sum of the first input signal and an additional analog signal of a frequency different from that of the first input signal and which is substituted for the first input signal. The meter may further comprise a second adder which adds another additional analog signal to the second input signal. Alternatively, the meter comprises low-pass filters and oversample-and-convert circuits to produce the first and the second input digital signals. As a further alternative, the meter comprises a first inverter for inverting a selected one of the first and the second input signals into a first inverted signal. In this event, a first selector alternatingly selects one of the first inverted signal and the selected one of the first and the second input signals and the other of the first inverted signal and the selected one of the first and the second input signals at a predetermined time interval as a first selected signal. A second inverter for inverting a product signal representing a product of the first and the second digital signals into a second inverted signal. Ganged with the first selector, a second selector alternatingly selects one of the second inverted signal and the product signal at the predetermined time interval as a second selected signal so that the second inverted signal is selected when the first selector selects the first inverted signal.

2 Claims, 11 Drawing Sheets

METER FOR ACCURATELY MEASURING INTEGRATED ELECTRIC POWER

BACKGROUND OF THE INVENTION

This invention relates to an electric power meter for measuring an integrated electric power of an alternating current.

An electric power meter of the type described, is typically a watt-hour meter which measures an integral value, with respect to time, of an electric power of the alternating current. The alternating current has a frequency of, for example, 50 Hz or 60 Hz.

A conventional electric power meter comprises a first converter which converts a first input signal representative of an analog electric current of the alternating current into a first digital signal. A second converter converts a second input signal representative of an analog voltage of the alternating current into a second digital signal. An analog-to-digital converter is typically used as each of the first and the second converters.

Connected to the first and the second converters, a multiplier calculates a product of the first and the second digital signals to produce a product signal. Connected to the multiplier, an integrator integrates the product signal to produce a meter output signal representative of an integrated electric power of the alternating current.

With this structure, quantization noise or distortion is inevitably generated in each of the first and the second converters as known in the art. Generation of the quantization noise results in a degraded accuracy of measurement of the integrated electric power.

In order to elevate the accuracy of the measurement, it is necessary to use, as each of the first and the second converters, an analog-to-digital converter of a high accuracy of analog-to-digital conversion. In asmuch as the analog-to-digital converter of the high accuracy has generally a complicated structure so as to produce an output signal having an increased number of bits, it is unavoidable that the conventional electric power meter has a complicated structure.

In addition, an offset is inevitably generated in each of the first and the second converters. As will later be described more in detail, the offset appears in an output signal of each of the first and the second converters and is equal to a difference between a desired output signal and an actual output signal which is actually obtained in the converter in question. Generation of the offset also results in a degraded accuracy of measurement of the integrated electric power.

SUMMARY OF THE INVENTION

It is therefore an object of this invention to provide an electric power meter which can accurately measure an integrated electric power.

It is another object of this invention to provide an electric power meter of the type described, which has a simple structure.

It is still another object of this invention to provide an electric power meter of the type described, which is not influenced by quantization noise generated in first and second converters for use in converting an analog signal into a digital signal.

It is yet another object of this invention to provide an electric power meter of the type described, which is not influenced by offsets generated in the first and the second converters.

Other objects of this invention will become clear as the description proceeds.

According to an aspect of this invention, there is provided an electric power meter comprising: an adder for producing a sum signal representative of a sum of an additional analog signal and a first input signal representative of a predetermined one of an analog electric current and an analog voltage of an alternating current; first converting means connected to the adder for converting the sum signal into a first digital signal; second converting means supplied with a second input signal representative of the other of the analog electric current and the analog voltage for converting the second input signal into a second digital signal; multiplying means connected to the first and the second converting means for calculating a product of the first and the second digital signals to produce a product signal representative of the product; and integrating means connected to the multiplying means for integrating the product signal to produce a meter output signal representative of an integrated electric power of the alternating current.

According to another aspect of this invention, there is provided an electric power meter comprising: a first low-pass filter having a first predetermined cutoff frequency for filtering a first input signal representative of an analog electric current of an alternating current to produce a first filtered signal, the first predetermined cutoff frequency being higher than a first Nyquist rate which is substantially equal to twice a first frequency of the first input signal; first oversample-and-convert means connected to the first analog low-pass filter for oversampling the first filtered signal at a first sampling frequency higher than the first Nyquist rate into a first sampled signal and for converting said first sampled signal into a first digital signal; a second low-pass filter having a second predetermined cutoff frequency for filtering a second input signal representative of an analog voltage of the alternating current to produce a second filtered signal, the second predetermined cutoff frequency being higher than a second Nyquist rate which is substantially equal to twice a second frequency of the second input signal; second oversample-and-convert means connected to the second low-pass filter for oversampling the second filtered signal at a second sampling frequency higher than the second Nyquist rate into a second sampled signal and for converting said second sampled signal into a second digital signal; multiplying means connected to the first and the second oversample-and-convert means for calculating a product of the first and the second digital signals to produce a product signal representative of the product; and integrating means connected to the multiplying means for integrating the product signal to produce a meter output signal representative of an integrated electric power of the alternating current.

According to still another aspect of this invention, there is provided an electric power meter comprising: first inverting means for inverting a first input signal representative of a predetermined one of an analog electric current and an analog voltage of an alternating current to produce a first inverted signal; first selecting means connected to the first inverting means and supplied with the first input signal for alternatingly selecting one of the first input signal and the first inverted signal and the other of the first input signal and the first inverted signal at a predetermined time interval as a first selected signal; first converting means connected to the first selecting means for converting the first selected signal into a first digital signal; second converting means supplied with a second input signal representative of the other of the analog electric current and the analog voltage for converting the second input signal into a second digital signal; multiplying means connected to the first and the second converting means for calculating a product of the first and the second digital signals to produce a product signal representative of the product; second inverting means connected to the multiplying means for inverting the product signal to produce a second inverted signal; second selecting means connected to the multiplying means and the second inverting means and ganged with the first selecting means for alternatingly selecting one of the product signal and the second inverted signal and the other of the product signal and the second inverted signal at the predetermined time interval as a second selected signal so that the product signal is selected when the first selecting means selects the first input signal and that the second inverted signal is selected when the first selecting means selects the first inverted signal; and integrating means connected to the second selecting means for integrating the second selected signal to produce a meter output signal representative of an integrated electric power of the alternating current.

According to yet another aspect of this invention, there is provided an electric power meter comprising: first inverting means for inverting a first input signal representative of a predetermined one of an analog electric current and an analog voltage of an alternating current to produce a first inverted signal; first selecting means connected to the first inverting means and supplied with the first input signal for alternatingly selecting one of the first input signal and the first inverted signal and the other of the first input signal and the first inverted signal at a predetermined time interval as a first selected signal; first converting means connected to the first selecting means for converting the first selected signal into a first digital signal; second inverting means connected to the first converting means for inverting the first digital signal to produce a second inverted signal; second selecting means connected to the first converting means and the second inverting means and ganged with the first selecting means for alternatingly selecting one of the first digital signal and the second inverted signal and the other of the first digital signal and the second inverted signal at the predetermined time interval as a second selected signal so that the first digital signal is selected when the first selecting means selects the first input signal and that the second inverted signal is selected when the first selecting means selects the first inverted signal; second converting means supplied with a second input signal representative of the other of the analog electric current and the analog voltage for converting the second input signal into a second digital signal; multiplying means connected to the second selecting means and the second converting means for calculating a product of the second selected signal and the second digital signal to produce a product signal representative of the product; and integrating means connected to the multiplying means for integrating the product signal to produce a meter output signal representative of an integrated electric power of the alternating current.

According to a further aspect of this invention, there is provided an electric power meter comprising: first converting means for converting a first input signal representative of an analog electric current of an alternating current into a first digital signal; second converting means for converting a second input signal representative of an analog voltage for converting into a second digital signal; first multiplying means connected to the first and the second converting means for calculating a first product of the first and the second digital signals to produce a first product signal representative of the first product; first integrating means connected to the first converting means for integrating the first digital signal to produce a first integrated signal; second integrating means connected to the second converting means for integrating the second digital signal to produce a second integrated signal; third integrating means connected to the first multiplying means for integrating the product signal to produce a third integrated signal; second multiplying means connected to the first and the second integrating means for calculating a second product of the first and the second integrated signals to produce a second product signal representative of the second product; and subtracting means connected to the third integrating means and the second multiplying means for subtracting the second product signal from the third integrated signal to produce a meter output signal representative of an integrated electric power of the alternating current.

DESCRIPTION OF THE PREFERRED EMBODIMENTS

Figure 1:
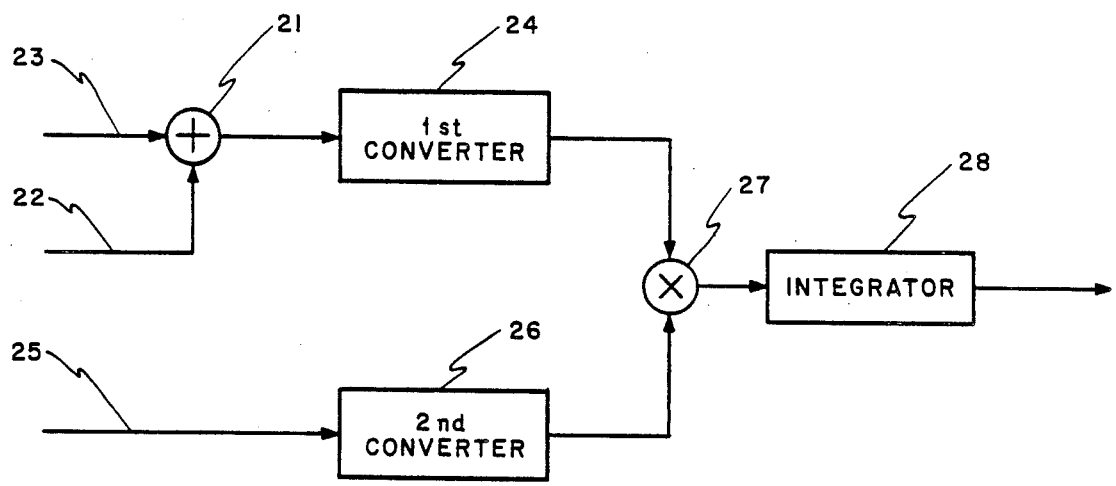
FIG. 1 is a block diagram of an electric power meter according to a first embodiment of this invention.

Referring to FIG. 1, an electric power meter according to a first embodiment of this invention comprises an adder 21 which produces a sum signal representative of a sum of an additional analog signal 22 and a first input signal 23 representative of an analog electric current of an alternating current which has an alternating-current frequency f, such as 50 Hz.

Connected to the adder 21, a first converter 24 converts the sum signal into a first digital signal. Supplied with a second input signal 25 representative of an analog voltage of the alternating current, a second converter 26 converts the second input signal 25 into a second digital signal.

A multiplier 27 is connected to the first and the second converters 24 and 26 to calculate a product of the first and the second digital signals to produce a product signal representative of the product. Connected to the multiplier 27, an integrator 28 integrates the product signal to produce a meter output signal representative of an integrated electric power of the alternating current.

As will be described in the following, the additional signal 22 is for use in reducing quantization noise which is generated in the first converter 24. For this purpose, the additional analog signal 22 has a particular frequency $f'$ which is different from the alternating-current frequency $f$.

As usual, each of the first and the second converters 24 and 26 includes a sampling circuit (not shown) operable at a predetermined sampling frequency T. Assuming that the first input signal 23 alone is sampled into a sampled signal io(nT) in the first converter 24, the sampled signal io(nT) is represented by:

$$io(nT) = I \sin(wnT),$$

where I represents an amplitude of the first input signal 23, w is equal to $2\pi f$, and n represents an integer which is not less than zero.

In this manner, the sum signal is sampled into an actual sampled signal i(nT) represented by:

$$i(nT) = I \sin(wnT) + I' \sin(w'nT),$$

where $I'$ represents an amplitude of the additional analog signal 22 and $w'$ is equal to $2\pi f'$.

The first digital signal is unavoidably accompanied by current quantization noise qi(nT). When denoted by [i(nT)], the first digital signal [i(nT)] is represented by:

$$[i(nT)] = I \sin(wnT) + I' \sin(w'nT) + qi(nT).$$

The second digital signal is accompanied by voltage quantization noise qv(nT). When denoted by [v(nT)], the second digital signal [v(nT)] is likewise represented by:

$$[v(nT)] = V \sin(wnT) + qv(nT),$$

where V represents an amplitude of the second input signal 25.

The product signal produced by the multiplier 27 is represented by:

$$[i(nT)][v(nT)].$$

The meter output signal produced by the integrator 28 is therefore represented by:

$$\int_0^t [i(nT)][v(nT)]d(nT), \quad (1)$$

where t represents time.

Inasmuch as the amplitude V of the second input signal 25 is generally a constant, it is possible to reduce the voltage quantization noise qv(nT) to a negligible degree by converting the second input signal 25 near a full scale of the second converter 26.

However, the amplitude I of the first input signal 23 generally varies in a wider range. Therefore, when the first input signal 23 has a small amplitude, the current quantization noise qi(nT) becomes to have a magnitude which is not negligible.

When the voltage quantization noise qv(nT) can be neglected, the product signal is represented by a sum of first through third terms as:

$$[i(nT)][v(nT)] = IV \sin^2(wnT) + I'V \sin(w'nT) \sin(wnT) + qi(nT)V \sin(wnT). \quad (2)$$

Although the first term $IV \sin^2(wnT)$ and the third term $qi(nT)V \sin(wnT)$ on the right-hand side of Equation (2) are present in the product signal no matter whether or not the additional analog signal 22 is added to the first input signal 23, the second term $I'V \sin(w'nT) \sin(wnT)$ of the right-hand side of Equation (2) is present in the product signal only when the additional analog signal 22 is added to the first input signal 23. Presence of the second term makes it possible to reduce in the product signal an influence of the third term (namely, the current quantization noise qi(nT)) to a negligible degree. This is because the additional analog signal 22 has the particular frequency $f'$ which is different from the alternating-current frequency $f$. Even though the presence of the second term might influence integration of the integrator 28, this never results in a degraded accuracy of measurement of the integrated electric power. This is because a result of the integration of the second term periodically becomes equal to zero because $w' \neq w$.

Figure 2:
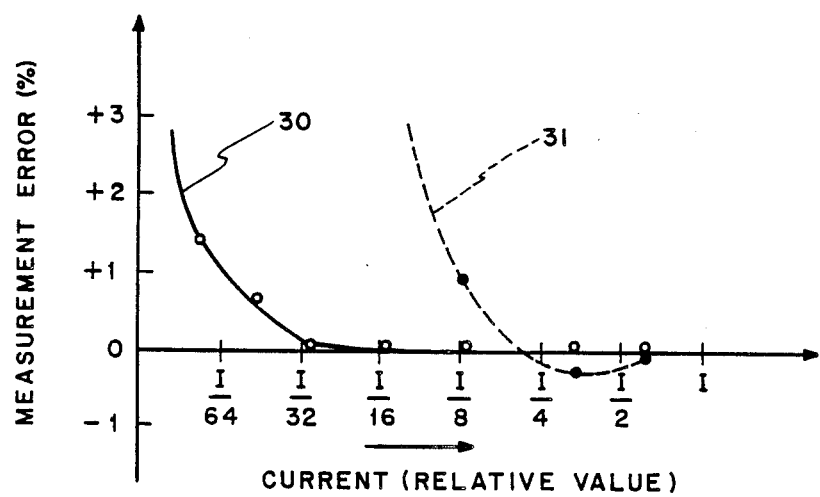
FIG. 2 is a graph for use in describing merits of the electric power meter illustrated in FIG. 1.

Turning to FIG. 2, description will proceed to a measurement error characteristic of the electric power meter illustrated in FIG. 1. It is to be noted here that the measurement error characteristic is obtained under the condition that each of the first and the second converters 24 and 26 can produce an output digital signal of six bits and that the alternating-current frequency f is equal to 50 Hz while the particular frequency $f'$ is equal to 20 Hz. In FIG. 2, the ordinate represents a measurement error of the electric power meter while the abscissa represents a magnitude of a current which is represented by a relative value relative to a maximum of an amplitude I of the first input signal 23.

A curve 30 shows a measurement error characteristic which is obtained when an amplitude $I'$ of the additional analog signal 22 is equal to I/18. Another curve 31 shows a measurement error characteristic which is obtained when the amplitude $I'$ of the additional analog signal 22 is equal to zero. In other words, the curve 31 is obtained when the additional analog signal 22 is not added to the first input signal 23. As is apparent from FIG. 2, the measurement error decreases when the additional analog signal 22 is added to the first input signal 23.

Figure 3:
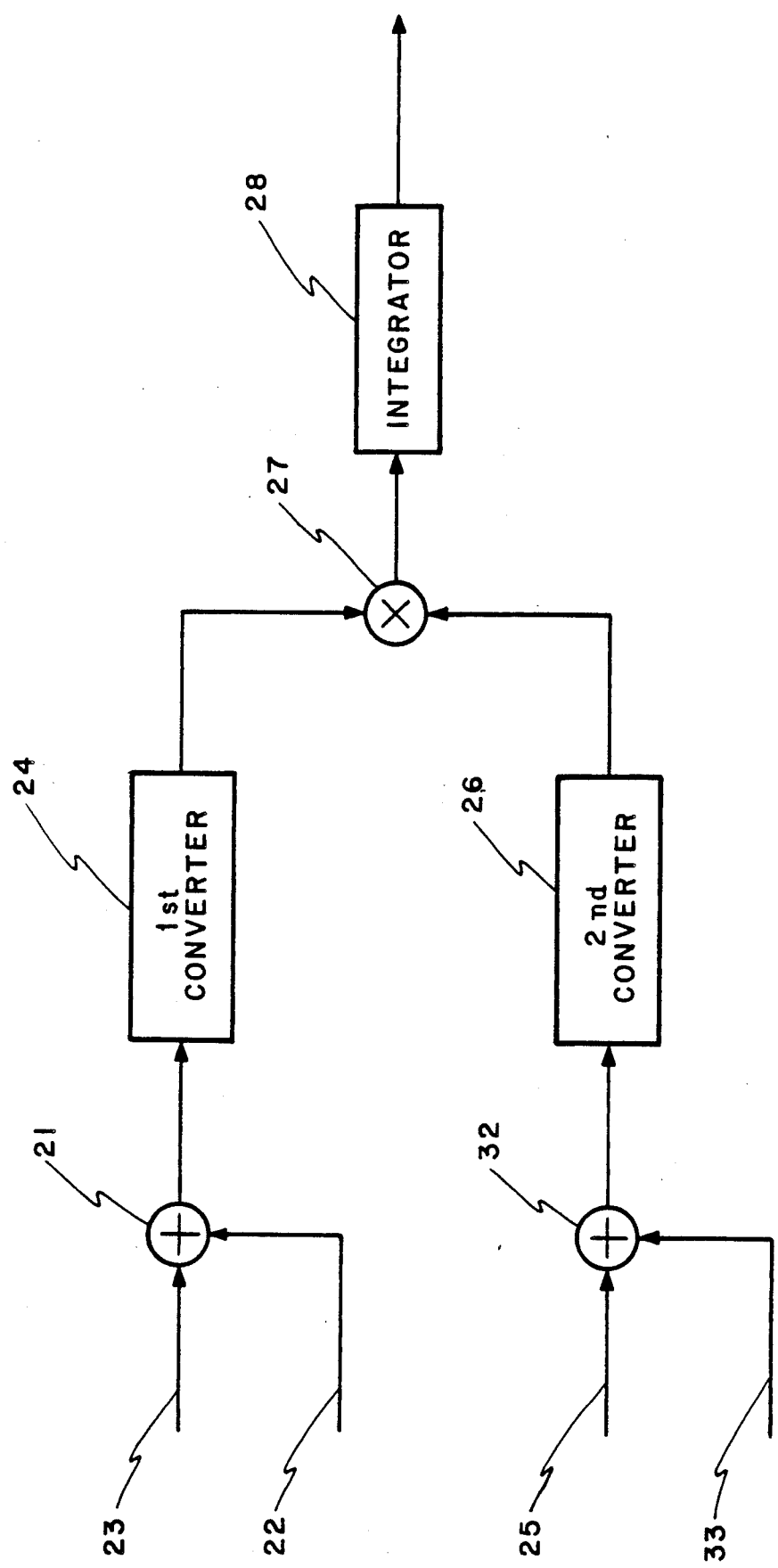
FIG. 3 is a block diagram of an electric power meter according to a second embodiment of this invention.

Turning to FIG. 3, an electric power meter according to a second embodiment of this invention is similar to the electric power meter of FIG. 1 except for the following. It is to be noted in FIG. 3 that the adder 21, the additional analog signal 22, and the sum signal will be referred to as a first adder, a first additional analog signal, and a first sum signal, respectively, merely for convenience of description. In FIG. 3, the electric power meter comprises a second adder 32 for producing a second sum signal representative of a second sum of a second additional analog signal 33 and the second input signal 25. The second converter 26 is connected to the second adder 32 to convert the second sum signal into the second digital signal.

Like the first additional analog signal 22, the second additional analog signal 33 is for use in reducing the voltage quantization noise qv(nT) which is inevitably and undesiredly generated in the second converter 26. For this purpose, the second additional analog signal 33 has a specific frequency f'' which is different from the alternating-current frequency f and is different from the particular frequency f'. The second additional analog signal 33 should be selected so that no correlation is present between the first and the second additional analog signals 22 and 33. Use is made of a sine wave signal, a triangular wave signal, a white noise signal, or the like as each of the first and the second additional signals 22 and 33. In FIG. 3, one of the first and the second input signals 23 and 25 may directly be supplied to a corresponding one of the first and the second converters 24 and 26.

Figure 4:
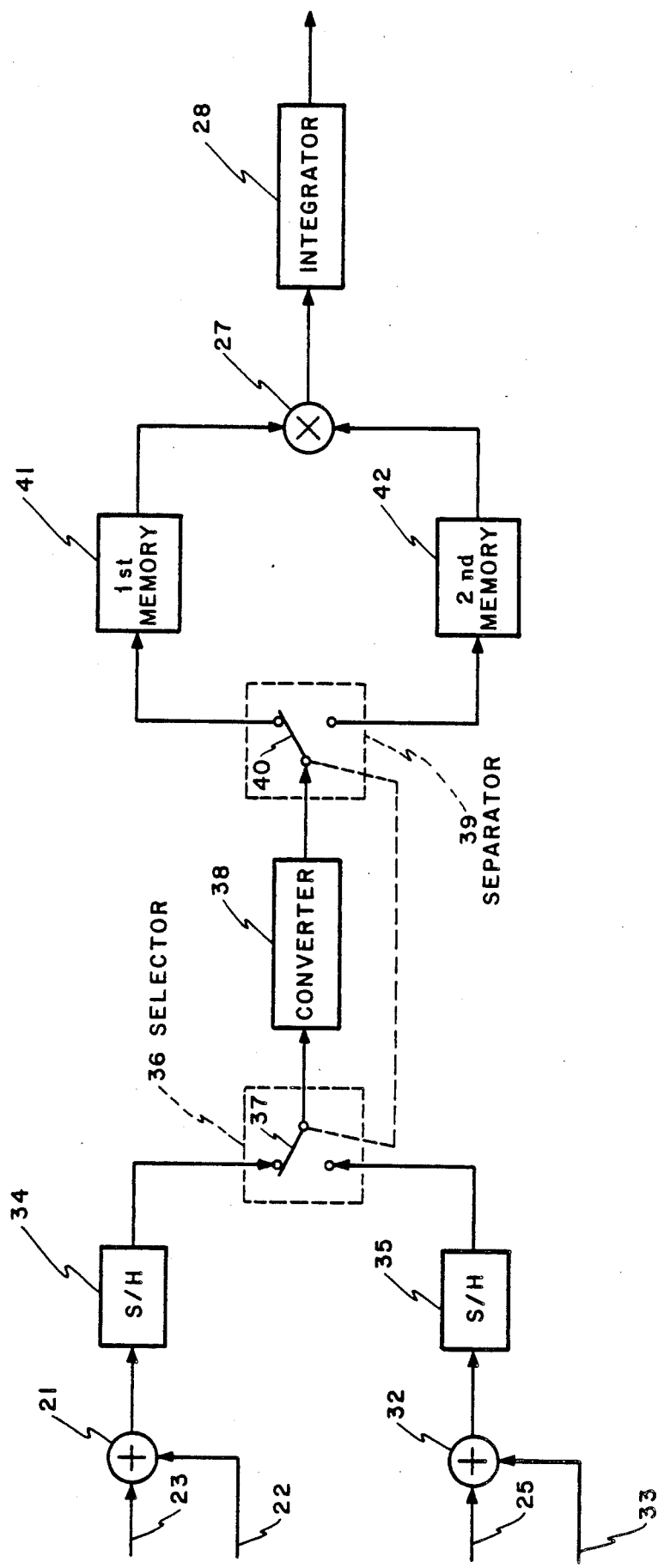
FIG. 4 is a block diagram of an electric power meter according to a third embodiment of this invention.

Turning to FIG. 4, an electric power meter according to a third embodiment of this invention is similar to the electric power meter of FIG. 3 except for the following. A first sample-and-hold circuit (S/H) 34 is connected to the first adder 21 to sample the first sum signal into a first sampled signal and to hold the first sampled signal as a first held signal. Connected to the second adder 32, a second sample-and-hold circuit (S/H) 35 samples the second sum signal into a second sampled signal and holds the second sampled signal as a second held signal.

A held signal selector 36 is connected to the first and the second sample-and-hold circuits 34 and 35 to alternatingly select one of the first and the second held signals and the other of the first and the second held signals at a preselected period as a selected signal. For this purpose, the held signal selector 36 comprises a switching unit 37 depicted as a mechanical switch arm. Connected to the held signal selector 36, a converter 38 converts the selected signal into a digital signal.

A separator 39 is connected to the converter 38 and ganged with the held signal selector 36. The separator 39 alternatingly produces the digital signal as first and second separated signals at the preselected period so that the first separated signal is produced when the held signal selector 36 selects the first held signal and that the second separated signal is produced when the held signal selector 36 selects the second held signal. For this purpose, the separator 39 comprises another switching unit 40 depicted as a mechanical switch arm.

Connected to the separator 39, a first memory 41 memorizes the first separated signal as a first memorized signal. A second memory 42 is connected to the separator 39 for memorizing the second separated signal as a second memorized signal.

The multiplier 27 is connected to the first and the second memories 41 and 42 to calculate a product of the first and the second memorized signals. The multiplier 27 thereby produces a product signal representative of the product.

In FIG. 4, the second adder 32 may be removed from the electric power meter like in the electric power meter illustrated in FIG. 1. In this case, the second sample-and-hold circuit 35 is supplied directly with the second input signal 25 to sample the second input signal 25 into the second sampled signal and to hold the second sampled signal as the second held signal. In general, one of the first and the second input signals 23 and 25 may directly be supplied to a corresponding one of the first and the second sample-and-hold circuits 34 and 35.

Figure 5:
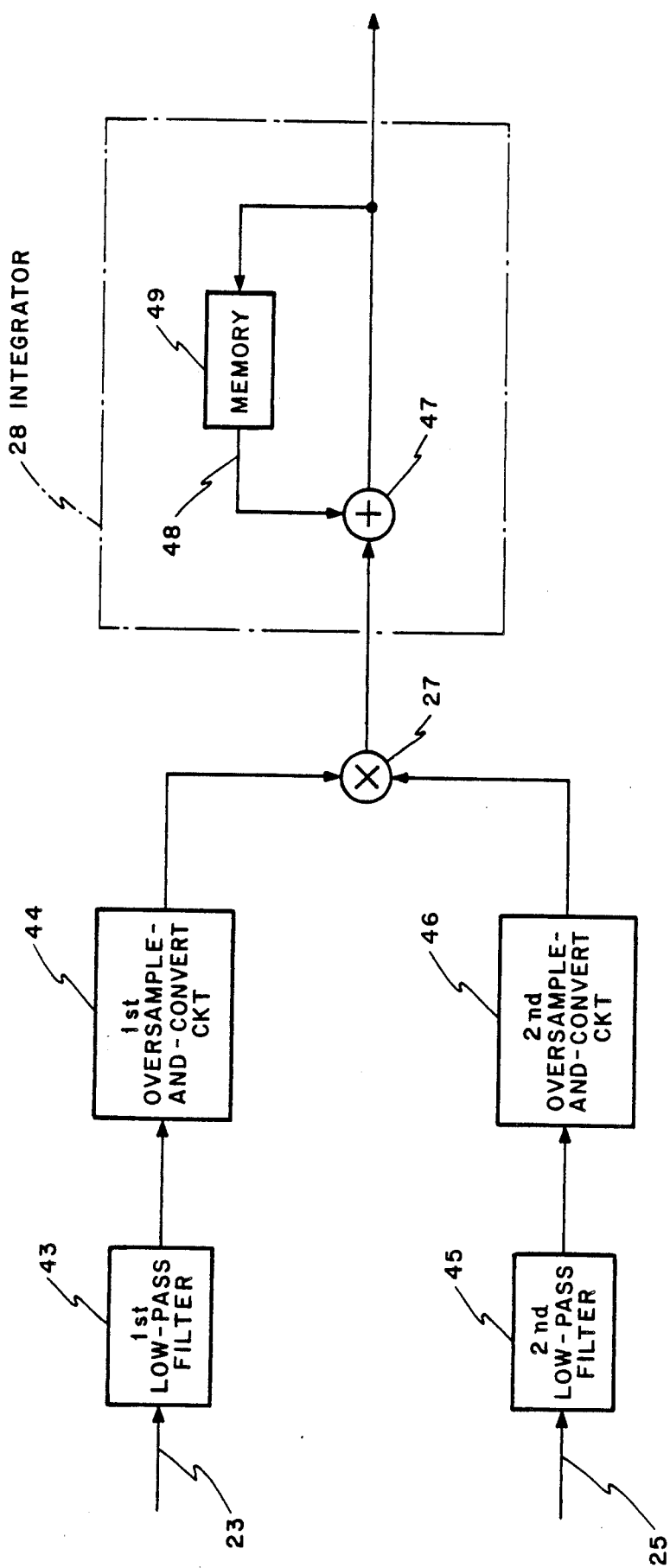
FIG. 5 is a block diagram of an electric power meter according to a fourth embodiment of this invention.

Turning to FIG. 5, an electric power meter according to a fourth embodiment of this invention is similar to the electric power meter of FIG. 1 except for the following. A first low-pass filter 43 has a first predetermined cutoff frequency. The first predetermined cutoff frequency is higher than a first Nyquist rate which is substantially equal to twice a first frequency of the first input signal 23. The first low-pass filter 43 filters the first input signal 23 into a first filtered signal. Connected to the first low-pass filter 43, a first oversample-and-convert circuit 44 oversamples the first filtered signal at a first oversampling frequency higher than the first Nyquist rate into a first sampled signal and for converting the first sampled signal into a first digital signal. Such an oversample-and-convert circuit is also called an oversampled analog-to-digital coder in the art.

A second low-pass filter 45 has a second predetermined cutoff frequency for filtering the second input signal 25 into a second filtered signal. The second predetermined cutoff frequency is higher than a second Nyquist rate which is substantially equal to twice a second frequency of the second input signal 25. The second predetermined cutoff frequency may or may not be equal to the first predetermined cutoff frequency. A second oversample-and-convert circuit 46 is connected to the second low-pass filter 45 for oversampling the second filtered signal at a second oversampling frequency higher than the second Nyquist rate into a second sampled signal and for converting the second sampled signal into a second digital signal. The second oversampling frequency may or may not be equal to the first oversampling frequency.

The multiplier 27 is connected to the first and the second oversample-and-convert circuits 44 and 46. The multiplier 27 calculates a product of the first and the second digital signals to produce a product signal representative of the product.

The integrator 28 comprises an integrator adder 47 which is connected to the multiplier 27 and supplied with the product signal from the multiplier 27 and with an integrated signal 48 which will presently be described. The adder 47 adds the product signal to the integrated signal 48 to produce an added signal. Connected to the adder 47, an integrator memory 49 memorizes the added signal as a memorized signal to deliver the memorized signal as the integrated signal 48. The added signal is used as the meter output signal. A delay circuit may be used instead of the integrator memory 49.

Returning to FIG. 6 in addition to FIG. 5, description will proceed to the first oversample-and-convert circuit 44. Although description will hereunder be made only as regards the first oversample-and-convert circuit 44, it should be understood that the second oversample-and-convert circuit 46 (FIG. 5) is similar in structure and in operation to the first oversample-and-convert circuit 44.

The first oversample-and-convert circuit 44 comprises a subtracter 50 connected to the first low-pass filter 43. The subtracter 50 subtracts a local converted signal 51 from the first filtered signal to produce a subtracted signal. Connected to the subtracter 50, an analog integrator 52 integrates the subtracted signal to produce an analog integrated signal.

A quantizer 53 is connected to the analog integrator 52 to quantize the analog integrated signal into a quantized signal. Connected to the quantizer 53, a digital delay 54 delays the quantized signal by a delay which is equal to a first sampling period determined by the first sampling frequency. The digital delay 54 thereby produces a delayed signal. Connected to the digital delay 54, a digital integrator 55 integrates the delayed signal to produce a digital integrated signal as the first digital signal.

A digital adder 56 is connected to the digital delay 54 and the digital integrator 55. The digital adder 56 adds the delayed signal to the digital integrated signal to produce a digital added signal. Connected to the digital adder 56, a local digital-to-analog converter 57 locally converts the digital added signal into the local converted signal 51.

Figure 6:
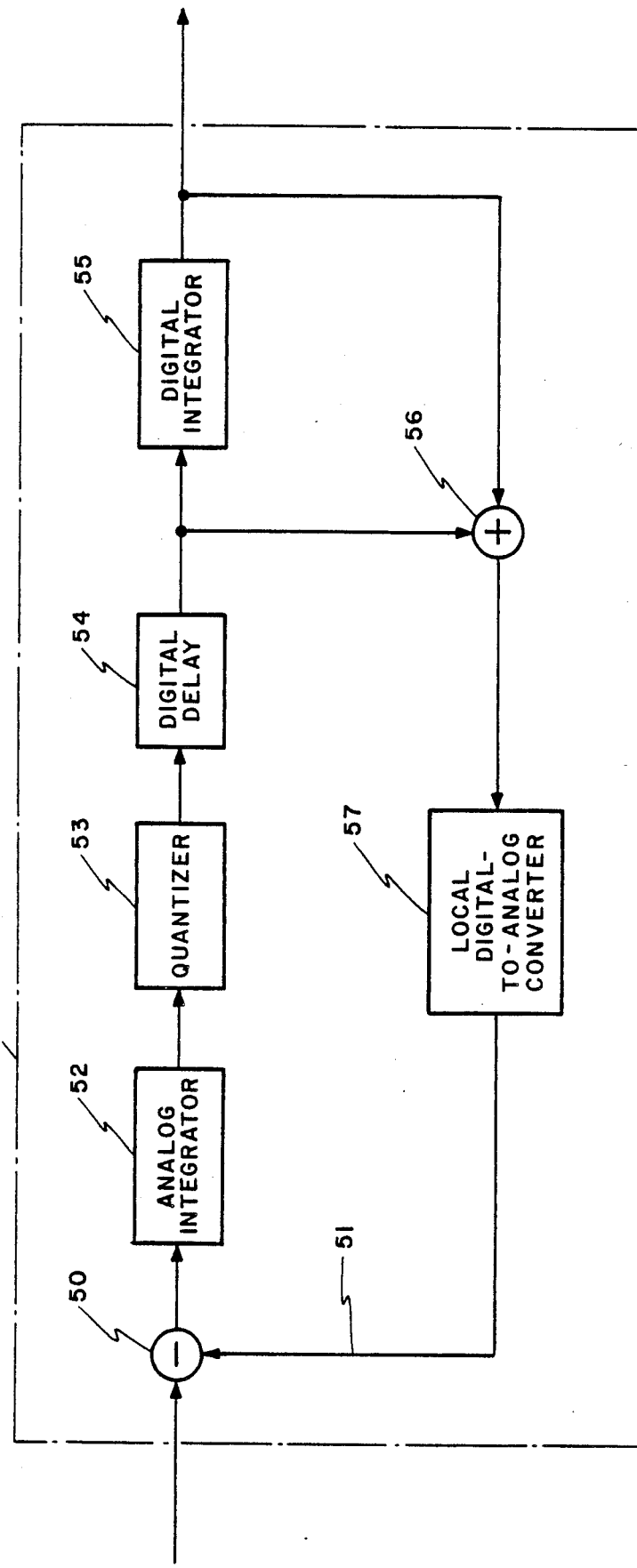
FIG. 6 is a block diagram of an oversample-and-convert circuit of the electric power meter illustrated in FIG. 5.

In FIGS. 5 and 6, it will be assumed that the first low-pass filter 43 produces the first filtered signal represented by xi and that the digital integrator 55 produces the first digital signal represented by yi. It will also be assumed that the quantizer 53 generates current quantization noise represented by qi and that X, Y, and Q represent z-transforms of the first filtered signal xi, of the first digital signal yi, and of the current quantization noise qi, respectively.

The z-transform Y of the first digital signal yi is given by:

$$Y = [X + (1 - Z^{-1})Q]Z^{-1}, \quad (3)$$

where $Z^{-1}$ represents a delay which is equal to the first sampling period. Thus, the first digital signal is accompanied by the current quantization noise.

Turning back to FIG. 5, description will proceed to operation of the multiplier 27 and the integrator 28. As mentioned above, the first and the second oversample-and-convert circuits 44 and 46 produce the first and the second digital signals, respectively. From Equation (3), the first digital signal yi is represented by:

$$yi = xi + qi. \quad (4)$$

When denoted by yv, the second digital signal yv is likewise represented by:

$$yv = xv + qv. \quad (5)$$

where xv represents the second filtered signal while qv represents voltage quantization noise.

The multiplier 27 produces the product signal which is represented by P and which is given by:

$$\begin{aligned} P &= yi * yv \quad (6) \\ &= (xi + qi)(xv + qv) \\ &= xi * xv + xi * qv + xv * qi + qi * qv, \end{aligned}$$

namely, by a four-term sum of first through fourth terms.

Inasmuch as each of the current and the voltage quantization noise qi and qv is random noise, no correlation is present between the first filtered signal xi and the voltage quantization noise qv, between the second filtered signal xv and the current quantization noise qi, and between the current and the voltage quantization noise qi and qv. Therefore, an integral value of each of the second through the fourth terms of the four-term sum in Equation (6) becomes equal to zero. As a result, the integrator 28 produces the meter output signal represented by:

$$\begin{aligned} \int P\, dt &= \int yi * yv\, dt \quad (7) \\ &= \int xi * xv\, dt. \end{aligned}$$

Figure 7:
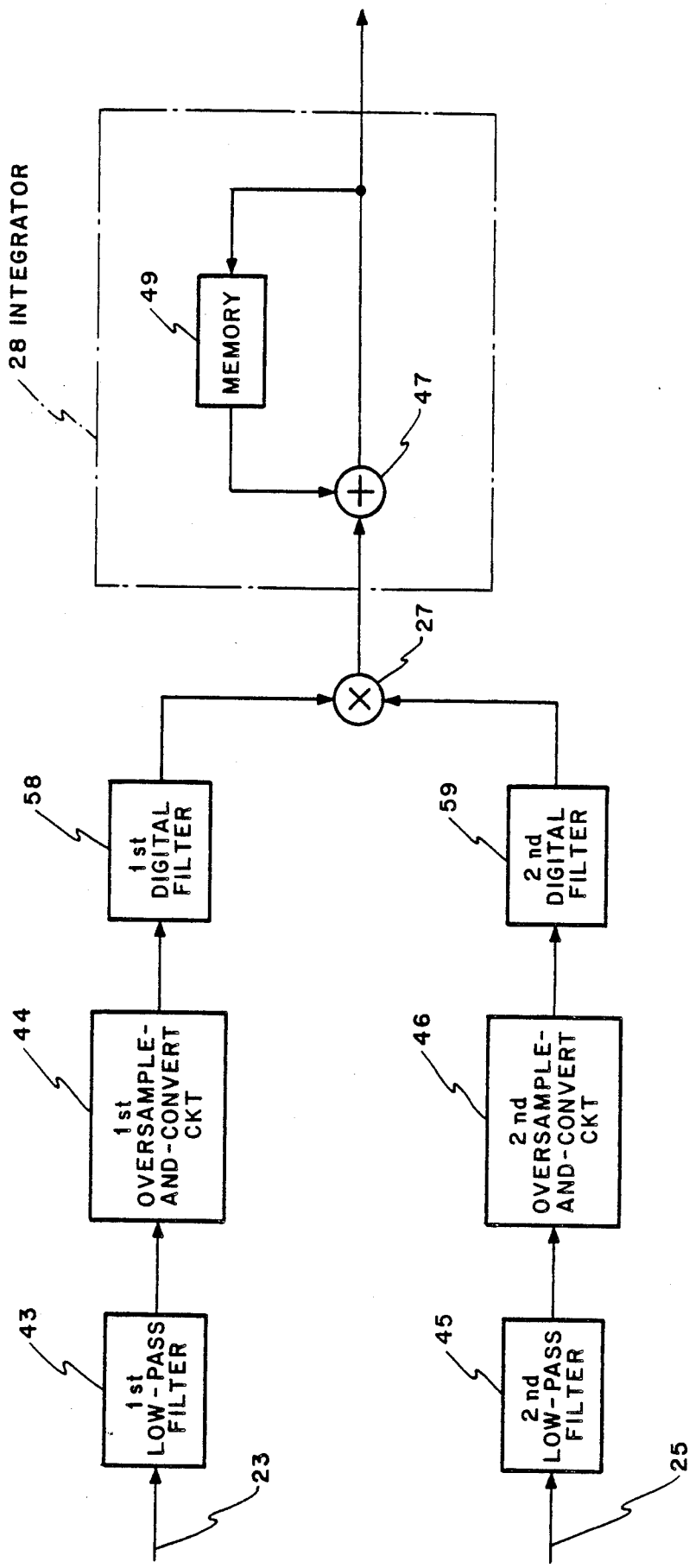
FIG. 7 is a block diagram of an electric power meter according to a fifth embodiment of this invention.

Turning to FIG. 7, an electric power meter according to a fifth embodiment of this invention is similar to the electric power meter of FIG. 5 except for the following. A first digital filter 58 is connected to the first oversample-and-convert circuit 44. The first digital filter 58 filters the first digital signal into a first filtered digital signal so as to remove first quantization noise (namely, the current quantization noise) from the first digital signal. The current quantization noise is generated in the first oversample-and-convert circuit 44 as described above. The first filtered digital signal is supplied to the multiplier 27 as the first digital signal.

Connected to the second oversample-and-convert circuit 46, a second digital filter 59 filters the second digital signal into a second filtered digital signal so as to remove second quantization noise (namely, the voltage quantization noise) from the second digital signal. The voltage quantization noise is generated in the second oversample-and-convert circuit 46 as also mentioned above. The second filtered digital signal is supplied to the multiplier 27 as the second digital signal.

With this structure, the integrator 28 is not supplied with any current and voltage noise.

Figure 8:
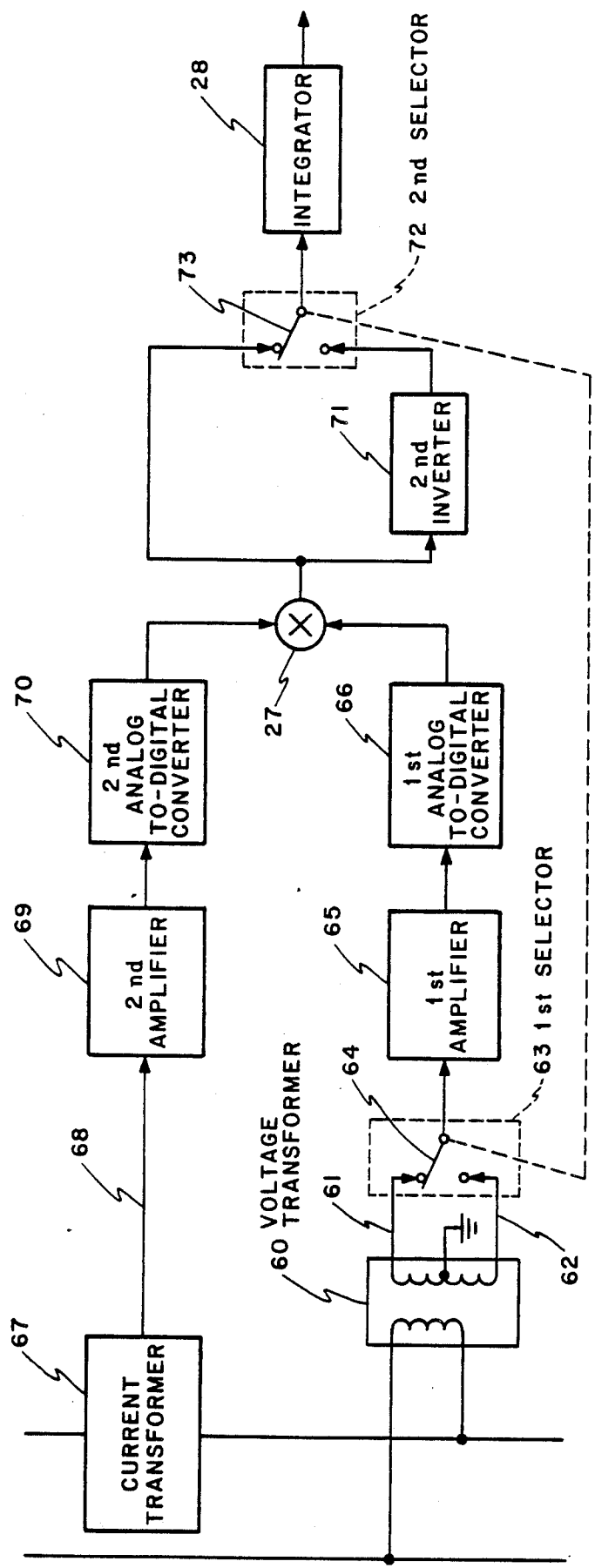
FIG. 8 is a block diagram of an electric power meter according to a sixth embodiment of this invention.

Turning to FIG. 8, an electric power meter according to a sixth embodiment of this invention comprises similar parts designated by like reference numerals. The electric power meter comprises a voltage transformer 60 comprising primary and secondary windings. An analog voltage of an alternating current is supplied across the primary winding. The secondary winding has a center tap grounded to produce first and second transformer output signals 61 and 62. The first transformer output signal 61 is the analog voltage as it stands. The second transformer output signal 62 is given by inverting the analog voltage, namely, the first transformer output signal 61. The first and the second transformer output signals 61 and 62 will herein be called a first input signal 61 and a first inverted signal 62. Thus, the voltage transformer 60 is operable as a first inverting unit which inverts the first input signal 61 to produce a first inverted signal 62.

A first selector 63 is connected to the transformer 60 (namely, the first inverting unit) and supplied with the first input signal 61 to alternatingly select one of the first input signal 61 and the first inverted signal 62 and the other of the first input signal 61 and the first inverted signal 62 at a predetermined time interval as a first selected signal. For this purpose, the first selector 63 comprises a switching unit 64 depicted as a mechanical switch arm.

Connected to the first selector 63 through a first amplifier 65, a first analog-to-digital converter 66 converts the first selected signal received through the first amplifier 65 into a first digital signal. Thus, a combination of the first amplifier 65 and the first analog-to-digital converter 66 serves as a first converting circuit which converts the first selected signal into the first digital signal.

A current transformer 67 is for producing a second input signal 68 representative of an analog electric current of the alternating current. Connected to the current transformer 67 through a second amplifier 69, a second analog-to-digital converter 70 converts the second input signal 68 received through the second amplifier 69 into a second digital signal. Thus, a combination of the second amplifier 69 and the second analog-to-digital converter 70 is operable as a second converting circuit which converts the second input signal 68 into the second digital signal.

The multiplier 27 produces a product signal representative of a product of the first and the second digital signals as described above. Connected to the multiplier 27, a second inverter 71 inverts the product signal into a second inverted signal.

A second selector 72 is connected to the multiplier 27 and ganged with the first selector 63. The second selector 72 alternatingly selects one of the product signal and the second inverted signal and the other of the product signal and the second inverted signal at the predetermined time interval as a second selected signal so that the product signal is selected when the first selector 63 selects the first input signal 61 and that the second inverted signal is selected when the first selector 63 selects the first inverted signal 62. For this purpose, the second selector 72 comprises a switching unit 73 depicted as a mechanical arm.

Connected to the second selector 72, the integrator 28 integrates the second selected signal to produce a meter output signal representative of an integrated electric power of the alternating current.

Figure 9:
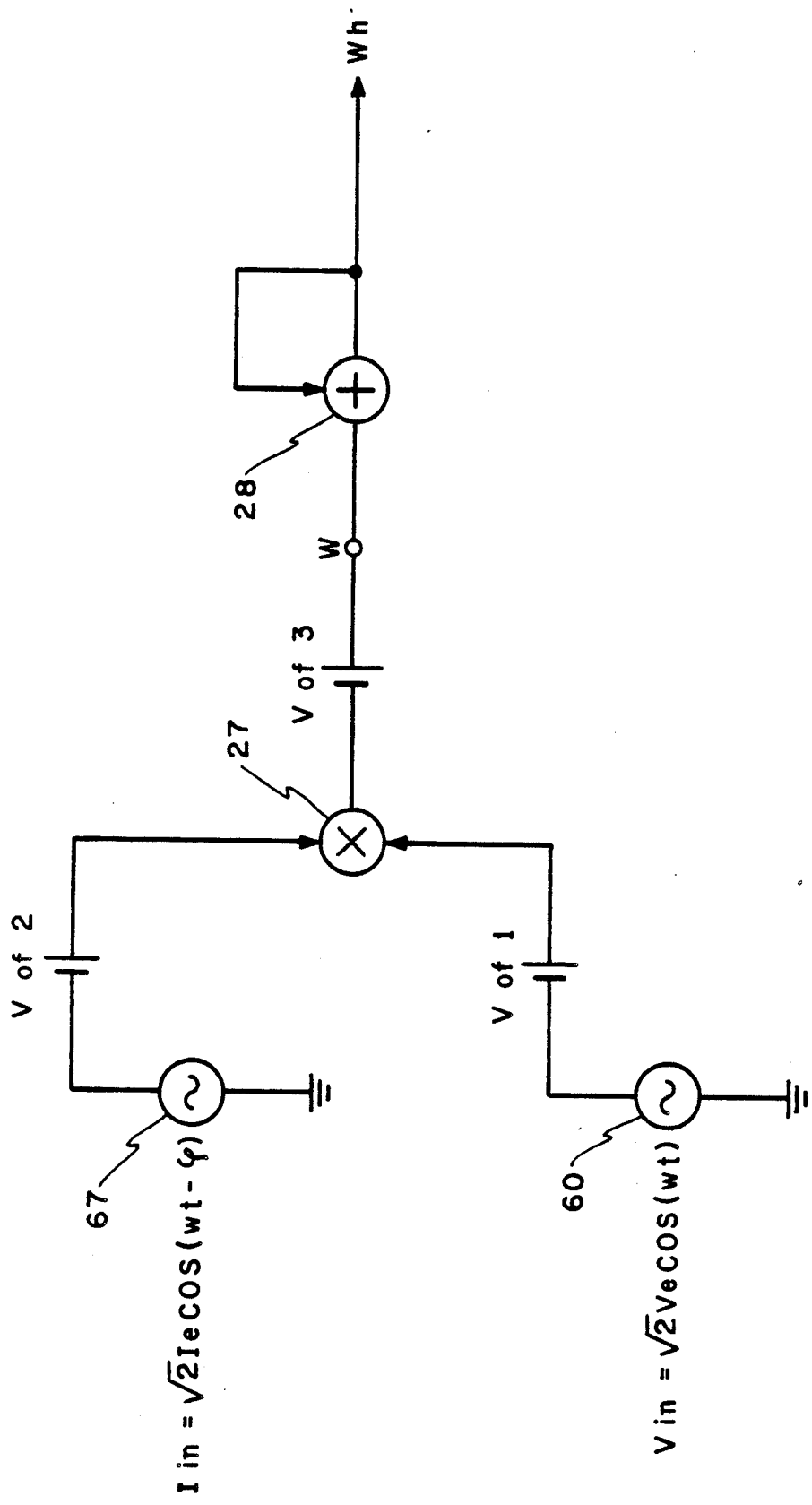
FIG. 9 is a diagram for use in describing operation of the electric power meter illustrated in FIG. 8.

Turning to FIG. 9, description will proceed to an equivalent circuit of the electric power meter of FIG. 8 when the first and the second selectors 63 and 72 select the first input signal 61 and the product signal, respectively. The voltage transformer 60 serves as a signal generator which generates the first input signal Vin represented by:

$$Vin = \sqrt{2}\ Ve * \cos(wt),$$

where Ve represents an effective value of the first input signal. Likewise, the current transformer 67 serves as another signal generator which generates the second input signal Iin represented by:

$$Iin = \sqrt{2}\ Ie * \cos(wt - \phi),$$

where Ie represents an effective value of the second input signal and $\phi$ represents a phase difference between the first and the second input signals.

In FIG. 9, Vof1 represents an offset generated in the first converting circuit (comprising the first amplifier 65 and the first analog-to-digital converter 66) while Vof2 represents another offset generated in the second converting circuit (comprising the second amplifier 69 and the second analog-to-digital converter 70). In addition, Vof3 represents an output offset of the multiplier 27.

The multiplier 27 produces the product signal which is now denoted by W and is represented by:

$$\begin{aligned} W &= (Vin + Vof1)(Iin + Vof2) + Vof3 \\ &= 2VeIe * \cos(wt)\cos(wt - \phi) + \\ &\quad \sqrt{2}\ Vof1 * Ie * \cos(wt - \phi) + \\ &\quad \sqrt{2}\ Vof2 * Ve * \cos(wt) + Vof1 * Vof2 + Vof3. \end{aligned} \quad (8)$$

Supposing that the integrator 28 integrates the product signal W a time duration which is equal to unit period T' ($T' = 2\pi/w$) of the alternating current, the integrator 28 produces an integrated electric power Wh1 which is represented by:

$$\begin{aligned} Wh1 &= \int_0^T W\ dt \\ &= T'\{Ve * Ie * \cos\phi + (Vof1 * Vof2 + Vof3)\}, \end{aligned} \quad (9)$$

namely, T' times a sum of first and second terms.

The second term (Vof1*Vof2+Vof3) of the sum in the right-hand side of Equation (9) represents a measurement error generated by the offsets.

Turning back to FIG. 8, operation of the electric power meter will be described as regards a case where the first and the second selectors 63 and 72 select the first inverted signal 62 and the second inverted signal, respectively. In this case, the multiplier 27 produces the product signal which is given by substituting −W' and −Ve for W and Ve, respectively, in Equation (8). That is, the product signal −W' is represented by, when its sign inverted:

$$\begin{aligned} W' &= 2VeIe * \cos(wt)\cos(wt - \phi) - \\ &\quad \sqrt{2}\ Vof1 * Ie * \cos(wt - \phi) + \sqrt{2}\ Vof2 * Ve * \cos(wt) - \\ &\quad Vof1 * Vof2 - Vof3. \end{aligned} \quad (10)$$

Supposing that the integrator 28 integrates the product signal W a following time duration from a time instant T' to another time instant 2T', the integrator 28 produces an integrated electric power Wh2 which is represented by:

$$\begin{aligned} Wh2 &= \int_T^{2T} W'\ dt \\ &= T'\{Ve * Ie * \cos\phi - (Vof1 * Vof2 + Vof3)\} \end{aligned} \quad (11)$$

From Equations (9) and (11), a mean value of Wh1 and Wh2 is given by:

$$(Wh1 + Wh2)/2 = T' * Ve * Ie * \cos\phi. \quad (12)$$

The right-hand of Equation (12) provides an accurate integrated electric power per unit period.

In FIG. 8, the first inverting unit (namely, the voltage transformer 60) inverts a meter input signal representative of the analog voltage of the alternating current. Alternatively, the first inverting unit may process another meter input signal representative of the analog electric current of the alternating current to produce the first inverted signal together with the first input signal. In this case, the first selector 63 alternatingly selects one of the last-mentioned input and inverted signals and the other of these input and inverted signals at the predetermined time interval. The predetermined time interval may be larger or shorter than the period of the alternating current.

Figure 10:
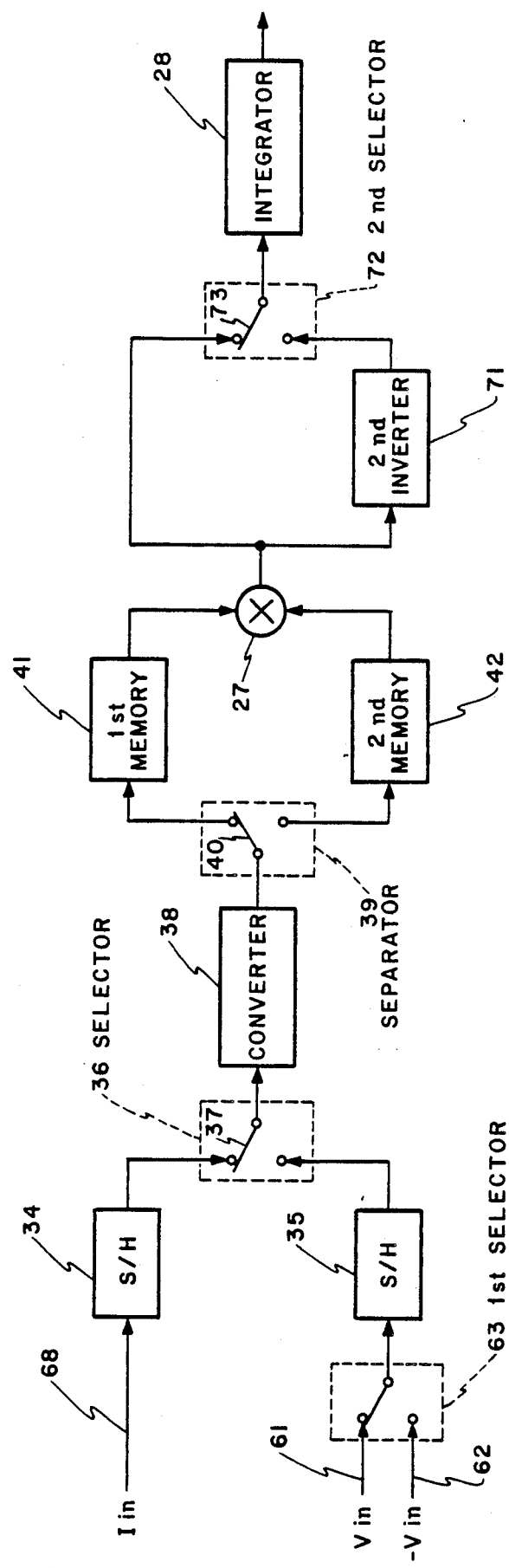
FIG. 10 is a block diagram of an electric power meter according to a seventh embodiment of this invention.

Turning to FIG. 10, an electric power meter according to a seventh embodiment of this invention is similar to the electric power meters of FIGS. 8 and 4 except for the following. The first sample-and-hold circuit 34 samples the input signal 68 representative of the analog electric current of the alternating current into the first sampled signal and holds the first sampled signal as the first held signal. The second sample-and-hold circuit 35 samples an output signal (namely, the first selected signal) of the first selector 63 into the second sampled signal and holds the second sampled signal as the second held signal. Similar parts are designated by like reference numerals.

Figure 11:
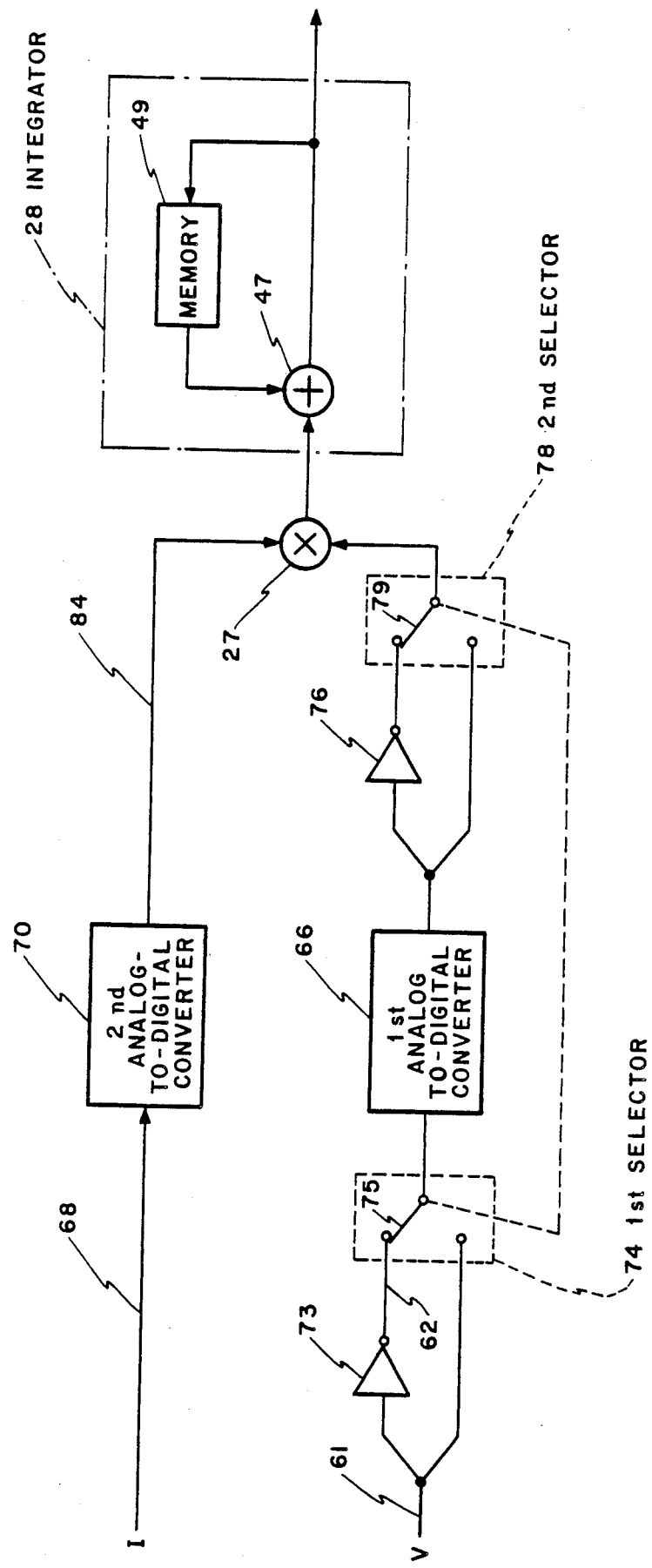
FIG. 11 is a block diagram of an electric power meter according to an eighth embodiment of this invention.

Turning to FIG. 11, an electric power meter according to an eighth embodiment of this invention is similar to the electric power meter of FIG. 8 except for the following. A first inverter 73 inverts the first input signal 61 and produces a first inverted signal 62. A first selector 74 is connected to the first inverter 73 and supplied with the first input signal 61 to alternatingly select one of the first input signal 61 and the first inverted signal 62 at a predetermined time interval as a first selected signal. For this purpose, the first selector 74 comprises a switching unit 75 depicted as a mechanical switch arm.

The first analog-to-digital converter 66 is connected to the first selector 74 to convert the first selected signal into a first digital signal.

A second inverter 76 is connected to the first analog-to-digital converter 66 and inverts the first digital signal to produce a second inverted signal. A second selector 78 is connected to the first analog-to-digital converter 66 and the second inverter 76 and ganged with the first selector 74. The second selector 78 alternatingly selects one of the first digital signal and the second inverted signal and the other of the first digital signal and the second inverted signal at the predetermined time interval as a second selected signal so that the first digital signal is produced when the first selector 74 selects the first input signal 61 and that the second inverted signal is selected when the first selector 74 selects the first inverted signal 62. For this purpose, the second selector 78 comprises another switching unit 79.

Supplied with a second input signal 68 representative of the analog electric current of the alternating current, a second analog-to-digital converter 70 converts the second input signal 68 into a second digital signal 84. Connected to the second selector 78 and the second converter 70, a multiplier 27 calculates a product of the second selected signal and the second digital signal 84 and produces a product signal representative of the product.

Description will proceed to operation of the electric power meter illustrated in FIG. 11. It will be assumed that the first input signal 61 is represented by:

$$V(1) = V \sin(wt + \phi s) \quad (13)$$

and that the second input signal 68 is represented by:

$$I(1) = I \sin(wt + \phi n), \quad (14)$$

where $\phi s$ represents a phase of the first input signal 61 and $\phi n$ represents another phase of the second input signal 68.

The second analog-to-digital converter 70 converts the second input signal 68 into the second digital signal 84 represented by:

$$I(2) = I \sin(wt + \phi n) + Iof, \quad (15)$$

where Iof represents an offset which is generated in the second analog-to-digital converter 70.

The first inverter 77 inverts the first input signal 61 into the first inverted signal 62 represented by:

$$V(2) = -V \sin(wt + \phi s), \quad (16)$$

Supposing that the switching units 75 and 79 are connected to the first and the second inverters 73 and 76, respectively, the first analog-to-digital converter 66 converts the first inverted signal 62 into the first digital signal represented by:

$$V(3) = -V \sin(wt + \phi s) + Vof, \quad (17)$$

where Vof represents another offset which is generated in the first analog-to-digital converter 66.

The second inverter 76 inverts the first digital signal represented by:

$$V(4) = V \sin(wt + \phi s) - Vof. \quad (18)$$

Supposing that the first input signal 61 is supplied to the first analog-to-digital converter 66 through the switching unit 75 and that the switching unit 79 is directly connected to the first analog-to-digital converter 66, the first analog-to-digital converter 66 converts the first input signal 61 into the first digital signal represented by:

$$V(5) = V \sin(wt + \phi s) + Vof. \quad (19)$$

When receives the second digital signal 84 and the second inverted signal, the multiplier 27 calculates a product of the second digital signal 84 and the second inverted signal and produces a product signal represented by:

$$\begin{aligned} I(2) * V(4) &= \{I\sin(wt + \phi n) + Iof\} * \\ &\quad \{V\sin(wt + \phi s) - Vof\} \\ &= IV\sin(wt + \phi n)\sin(wt + \phi s) - \\ &\quad IVof * \sin(wt + \phi n) + \\ &\quad VIof * \sin(wt + \phi s) - Iof * Vof \end{aligned} \quad (20)$$

When receives the second digital signal 84 and the first digital signal, the multiplier 27 calculates a product of the second digital signal 84 and the first digital signal and produces the product signal represented by:

$$\begin{aligned} I(2) * V(5) &= \{I\sin(wt + \phi n) + Iof\} * \\ &\quad \{V\sin(wt + \phi s) - Vof\} \\ &= IV\sin(wt + \phi n)\sin(wt + \phi s) + \\ &\quad IVof * \sin(wt + \phi n) + \\ &\quad VIof * \sin(wt + \phi s) - Iof * Vof. \end{aligned} \quad (21)$$

Assuming that the switching units 75 and 79 deliver the first input signal 61 and the first digital signal to the first analog-to-digital converter 66 and the multiplier 27, respectively, a time duration which is equal to unit period T' ($T'=2\pi/w$) of the alternating current and that the switching units 75 and 79 deliver the first inverted signal 62 and the second inverted signal to the first analog-to-digital converter 66 and the multiplier 27, respectively, a following time duration from a time instant T' to another time instant 2T', an integrated electric power P, which is given by integrating the product signal from zero to the other time instant 2T', is represented by:

$$P = \int_0^{T'} I(2) * V(4)\, dt + \int_{T'}^{2T'} I(2) * V(5)\, dt.$$

$$= \int_0^{2T'} [IV\sin(wt + \phi n)\sin(wt + \phi s) +$$

$$VIof * \sin(wt + \phi s)]\, dt +$$

$$\int_0^{T'} [-IVof * \sin(wt + \phi n) - Iof * Vof]\, dt +$$

$$\int_{T'}^{2T'} [IVof * \sin(wt + \phi n) + Iof * Vof]\, dt$$

$$= \int_0^{2T'} [IV\{\cos(\phi n - \phi s) - \cos(2wt + \phi n + \phi s)\} +$$

$$VIof * \sin(wt + \phi s)]\, dt +$$

$$\left[ \frac{IVof}{w} \cos(wt + \phi n) - Iof * Vof * t \right]_0^{T'} +$$

$$\left[ -\frac{IVof}{w} \cos(wt + \phi n) + Iof * Vof * t \right]_{T'}^{2T'}$$

$$= \left[ IV \left\{ t\cos(\phi n - \phi s) - \frac{1}{2w} \sin(2wt + \phi n + \phi s) \right\} - \right.$$

$$\left. \frac{Iof * V}{w} \cos(wt + \phi s) \right]_0^{2T'} +$$

$$[-Iof*Vof*T'] + Iof*Vof*T'$$

$$= 2T'IV\cos(\phi n - \phi s)$$

Supposing that another integrated electric power P' is given by integrating the product signal from zero to the other time instant 2T' when each of the current and the voltage noise Iof and Vof is equal to zero, the other integrated electric power P' is represented by:

$$P' = \int_0^{2T'} [IV\sin(wt + \phi n)\sin(wt + \phi s)]\, dt$$

$$= 2T'IV\cos(\phi n - \phi s).$$

Inasmuch as the integrated electric power P is equal to the other integrated electric power P', the current and the voltage noise Iof and Vof is removed from the integrated electric power P.

Figure 12:
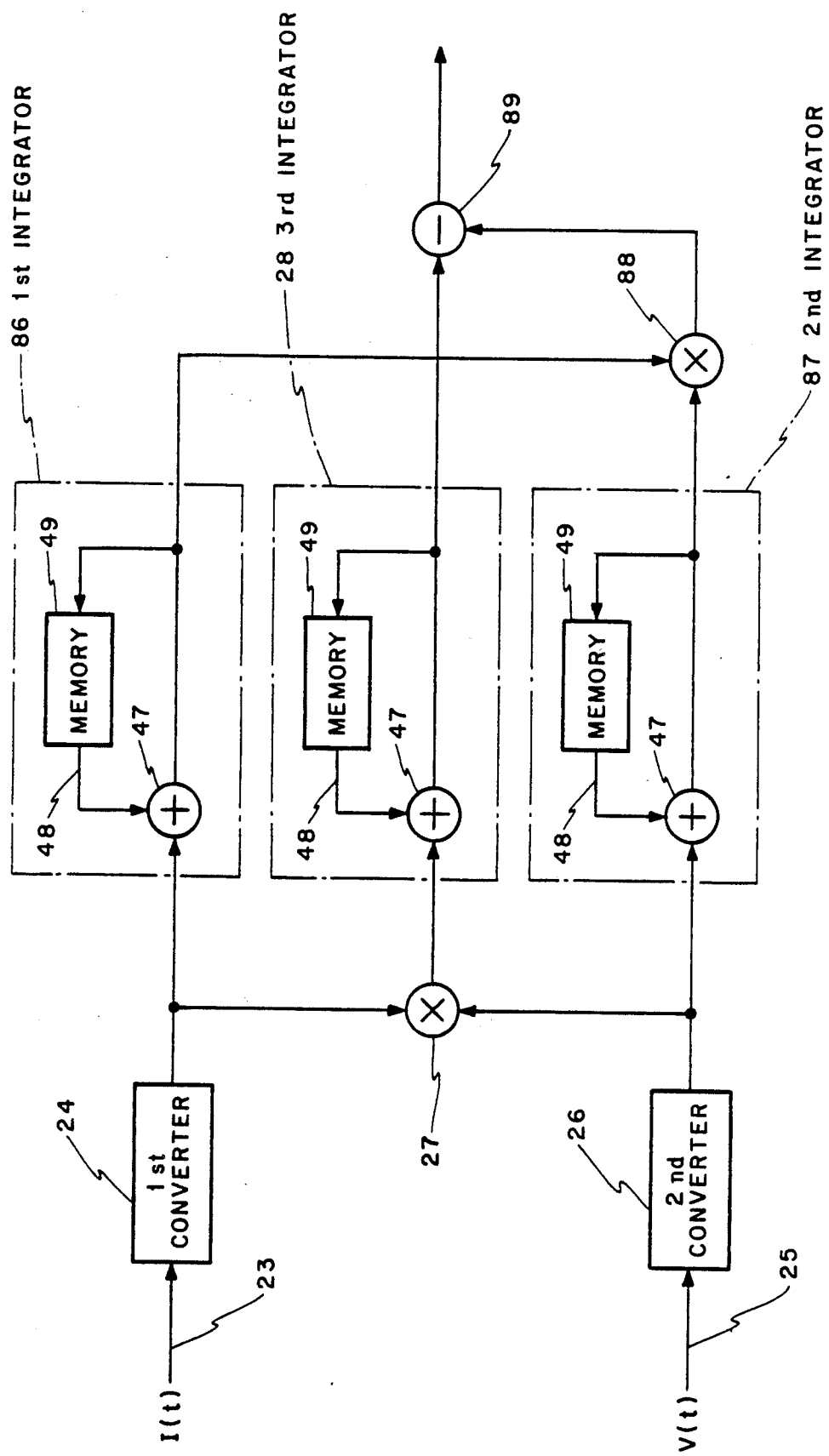
FIG. 12 is a block diagram of an electric power meter according to a ninth embodiment of this invention.

Turning to FIG. 12, an electric power meter according to a ninth embodiment of this invention comprises similar parts designated by like reference numerals. The first converter 24 is for converting the first input signal 23 representative of the analog electric current of the alternating current into a first digital signal. The second converter 26 is for converting the second input signal 25 representative of the analog voltage into a second digital signal. Connected to the first and the second converters 24 and 26, the first multiplier 27 calculates a first product of the first and the second digital signals to produce a first product signal representative of the first product.

A first integrator 86 is connected to the first converter 24. The first integrator 86 integrates the first digital signal into a first integrated signal. Connected to the second converter 26, a second integrator 87 integrates the second digital signal into a second integrated signal. Connected to the first multiplier 27, a third integrator 28 integrates the product signal and produces a third integrated signal.

A second multiplier 88 is connected to the first and the second integrators 86 and 87. The second multiplier 88 calculates a second product of the first and the second integrated signals to produce a second product signal representative of said second product.

A subtracter 89 is connected to the third integrator 28 and the second multiplier 88. The subtracter 89 subtracts the second product signal from the third integrated signal to produce a meter output signal representative of integrated electric power of said alternating current.

Description will proceed to operation of the electric power meter illustrated in FIG. 12. It will be presumed that the first digital signal is represented by:

$$I(t) = I \sin(wt + \theta + \phi) + Iof. \tag{22}$$

where $\theta$ represents a phase of the first digital signal, $\phi$ represents a phase difference between the first and the second digital signals, and Iof represents an output offset of the first converter 24. It will also be presumed that the second digital signal is represented by:

$$V(t) = V \sin(wt + \theta) + Vof. \tag{23}$$

where Vof represents another output offset of the second converter 26.

The first multiplier 27 produces an electric power P which is represented by:

$$\begin{aligned} P &= I(t) * V(t) \\ &= IV\sin(wt + \theta + \phi)\sin(wt + \theta) + \\ &\quad IVof * \sin(wt + \theta + \phi) + Iof * V\sin(wt + \theta) + Iof * Vof \\ &= \tfrac{1}{2}IV\{\cos\phi - \cos(2wt + 2\theta + \phi)\} + Iof * V\sin(wt + \\ &\quad \theta) + IVof * \sin(wt + \theta + \phi) + Iof * Vof. \end{aligned}$$

The third integrator 28 integrates the electric power to produce the third integrated signal represented by:

$$\int I(t)*V(t)dt = \tfrac{1}{2}IV \cos\phi \int dt + Iof \int dt * Vof \int dt. \tag{24}$$

The first integrator 86 integrates the first digital signal to produce the first integrated signal represented by:

$$\int I(t)dt = Iof \int dt. \tag{25}$$

The second integrator 87 integrates the second digital signal to produce the second integrated signal represented by:

$$\int V(t)dt = Vof \int dt. \tag{26}$$

The second multiplier 88 calculates a second product of the first and the second integrated signals and produces a second product signal represented by:

$$\int I(t)dt * \int V(t)dt = Ioff \int dt * Voff \int dt. \quad (27)$$

The subtracter 89 subtracts the second product signal from the third integrated signal to produce a meter output signal represented by:

$$\int I(t) * V(t) \, dt - \int I(t) \, dt * \int V(t) \, dt \quad (28)$$

$$= \tfrac{1}{2}IV\cos\phi \int dt + Ioff \int dt * Voff \int dt - Ioff \int dt * Voff \int dt.$$

$$= \tfrac{1}{2}IV\cos\phi \int dt$$

Supposing that no offset is present in each of the first and the second digital signals, an electric power is represented by:

$$I(t) * V(t) = IV\{\sin(wt + \theta + \phi)\sin(wt + \theta)\} \quad (29)$$

$$= \tfrac{1}{2}IV\{\cos\phi - \cos(2wt + 2\theta + \phi)\}.$$

When the electric power is integrated into an integrated electric power, the integrated electric power is represented by:

$$\int I(t)*V(t)dt = \tfrac{1}{2}IV \cos \phi \int dt. \quad (30)$$

As is apparent from comparison of Equation (28) with Equation (30), Equation (28) is equal to Equation (30). Thus, the subtracter 89 produces a meter output signal with the offsets removed.

What is claimed is:

1. An electric power meter comprising:
   a first low-pass filter having a first predetermined cutoff frequency for filtering a first input signal representative of an analog electric current of an alternating current to produce a first filtered signal, said first predetermined cutoff frequency being higher than a first Nyquist rate which is substantially equal to twice a first frequency of said first input signal;
   first oversample-and-convert means connected to said first analog low-pass filter for oversampling said first filtered signal at a first sampling frequency higher than said first Nyquist rate into a first sampled signal and for converting said first sampled signal into a first digital signal;
   a second low-pass filter having a second predetermined cutoff frequency for filtering a second input signal representative of an analog voltage of said alternating current to produce a second filtered signal, said second predetermined cutoff frequency being higher than a second Nyquist rate which is substantially equal to twice a second frequency of said second input signal;
   second oversample-and-convert means connected to said second low-pass filter for oversampling said second filtered signal at a second sampling frequency higher than said second Nyquist rate into a second sampled signal and for converting said second sampled signal into a second digital signal;
   multiplying means connected to said first and said second oversample-and-convert means for calculating a product of said first and said second digital signals to produce a product signal representative of said product; and
   integrating means connected to said multiplying means for integrating said product signal to produce a meter output signal representative of an integrated electric power of said alternating current.

2. An electric power meter as claimed in claim 1, further comprising:
   a first digital filter connected to said first oversample-and-convert means for filtering said first digital signal into a first filtered digital signal so as to remove first quantization noise from said first digital signal, said first quantization noise being generated in said first oversample-and-convert means, said first filtered digital signal being supplied to said multiplying means as said first digital signal; and
   a second digital filter connected to said second oversample-and-convert means for filtering said second digital signal into a second filtered digital signal so as to remove second quantization noise from said second digital signal, said second quantization noise being generated in said second oversample-and-convert means, said second filtered digital signal being supplied to said multiplying means as said second digital signal.

* * * * *

UNITED STATES PATENT AND TRADEMARK OFFICE
CERTIFICATE OF CORRECTION

PATENT NO.  :  4,992,725
DATED       :  February 12, 1991
INVENTOR(S) :  Komatsu et al.

It is certified that error appears in the above-identified patent and that said Letters Patent is hereby corrected as shown below:

On the Title page, insert the follows:

item [30], FOREIGN APPLICATION PRIORITY INFORMATION

December 26, 1988  [JP]  Japan  330489/1988
December 27, 1988  [JP]  Japan  328030/1988
November 16, 1989  [JP]  Japan  296144/1989

Signed and Sealed this

Twenty-fifth Day of May, 1993

Attest:

MICHAEL K. KIRK

Attesting Officer

Acting Commissioner of Patents and Trademarks